(12) United States Patent
Su

(10) Patent No.: US 6,204,547 B1
(45) Date of Patent: *Mar. 20, 2001

(54) MODIFIED POLY-BUFFERED ISOLATION

(75) Inventor: Wen-Doe Su, Hsinchu (CN)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/337,982

(22) Filed: Jun. 22, 1999

Related U.S. Application Data

(63) Continuation of application No. 08/798,231, filed on Feb. 11, 1997, now Pat. No. 5,977,608, and a division of application No. 08/534,778, filed on Sep. 27, 1995, now Pat. No. 5,747,357.

(51) Int. Cl.⁷ .................................................. H01L 21/76
(52) U.S. Cl. ........................................... 257/509; 438/448
(58) Field of Search ................................... 257/509, 506; 438/448, 439, 443

(56) References Cited

U.S. PATENT DOCUMENTS

| | | | |
|---|---|---|---|
| 3,970,486 | 7/1976 | Kooi | 257/626 |
| 4,508,757 | 4/1985 | Fabricius et al. | 438/444 |
| 4,630,356 * | 12/1986 | Christie et al. | 438/448 |
| 5,192,707 | 3/1993 | Hodges et al. | 438/448 |
| 5,338,968 | 8/1994 | Hodges et al. | 257/647 |
| 5,358,893 | 10/1994 | Yang et al. | 438/448 |
| 5,369,051 | 11/1994 | Rao et al. | 438/448 |
| 5,447,885 | 9/1995 | Cho et al. | 438/440 |
| 5,523,255 * | 6/1996 | Hyung et al. | 438/448 |
| 5,677,234 * | 10/1997 | Koo et al. | 438/439 |
| 6,096,613 * | 8/2000 | Wu | 438/448 |

FOREIGN PATENT DOCUMENTS 4-249324   4/1992   (JP).

OTHER PUBLICATIONS

Guidi, R.L. et al., "Characteristics of Poly–Buffered LOCOS in Manufacturing Environment," 1989, *J. Electrical Soc.*, vol. 136, No. 12, pp. 3815–3820.

\* cited by examiner

*Primary Examiner*—Olik Chaudhuri
*Assistant Examiner*—Anh Duy Mai
(74) *Attorney, Agent, or Firm*—Townsend and Townsend and Crew, LLP

(57) ABSTRACT

A method of forming field isolation regions (300) on a semiconductor substrate for an integrated circuit. The present method includes forming a sandwich type structure as an oxidation mask (140), (160), and (200). The present sandwich type structure includes an underlying oxide layer (120) formed overlying the top surface. The present sandwich type structure includes a polysilicon layer (140) overlying the oxide layer (120), a first silicon nitride layer (160) overlying the polysilicon layer (140), and a second silicon nitride layer (200) overlying the first silicon nitride layer (160) where the second silicon nitride layer (200) is much thicker than the first layer of silicon nitride (160). The present method also includes patterning the second silicon nitride layer (200), the first silicon nitride layer (160), and the polysilicon layer (140) to define an oxidation mask. The oxidation mask includes exposed regions (210) of the oxide layer (120) where field isolation oxide regions (300) will be formed therein.

34 Claims, 5 Drawing Sheets

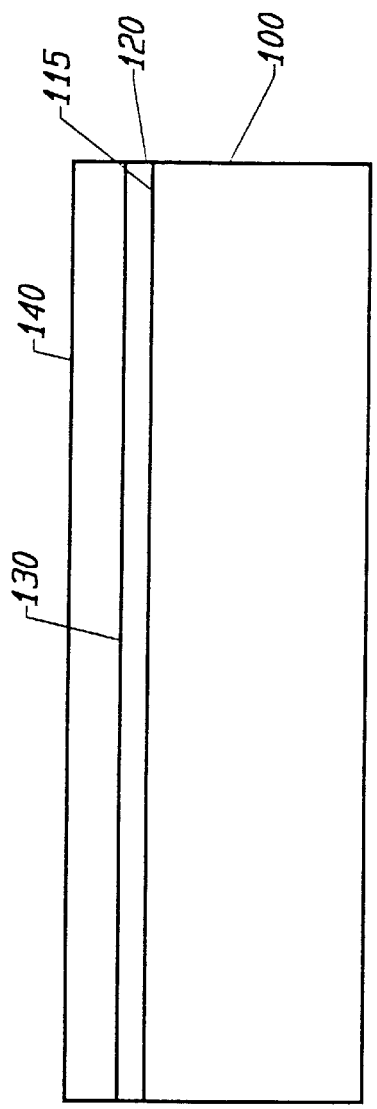
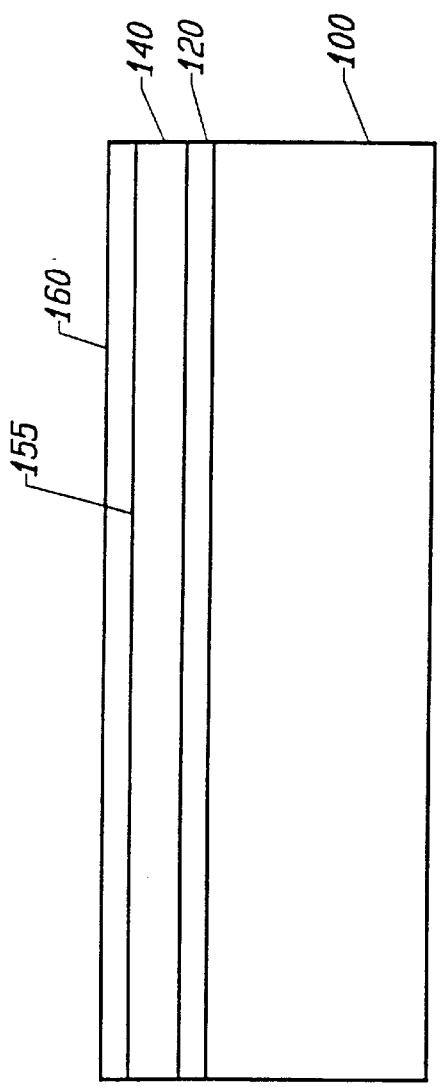
FIG. 4
FIG. 5

MODIFIED POLY-BUFFERED ISOLATION

This application is a continuation of and claims the benefit of U.S. application Ser. No. 08/798,231, filed Feb. 11, 1997 now Pat. No. 5,977.608 which is a divisional of U.S. patent application Ser. No. 08/534,778, filed Sept. 27, 1995, now U.S. Pat. No. 5,747,357, issued May 5, 1998, the disclosures of which are incorporated by reference.

BACKGROUND OF THE INVENTION

The present invention relates to semiconductor integrated circuits and their manufacture. The invention is illustrated in an example with regard to a method and structure for isolating devices such as metal oxide silicon (MOS) field effect transistors, but it will be recognized that the invention has a wider range of applicability. Merely by way of example, the invention may be applied in the manufacture of other semiconductor devices such as bipolar transistors, complementary metal oxide semiconductor (CMOS) field effect transistors, bipolar complementary metal oxide semiconductor (BiCMOS) field effect transistors, among others.

Industry utilizes or has proposed techniques for isolating devices in an integrated circuit device. An example of a technique is the local oxidation of silicon (LOCOS) as defined in U.S. Pat. No. 3,970,486, assigned to U.S. Philips Corp. The LOCOS technique generally includes steps of forming a thin silicon dioxide layer ($SiO_2$) (or pad oxide layer) overlying a silicon substrate. A layer of silicon nitride is formed overlying the silicon dioxide layer. A step of patterning the silicon nitride ($Si_3N_4$) layer to expose portions of the pad oxide is performed. The exposed portions of the pad oxide define regions for field isolation oxide. Using the silicon nitride as a mask, a step of thermal oxidation forms field isolation oxide regions in the exposed pad oxide regions.

A limitation with the LOCOS technique is certain undesirable effects caused by lateral oxidation of silicon dioxide occurs as illustrated by FIG. 1. In particular, the lateral oxidation of silicon dioxide often causes an undesirable "bird's beak" type structure. As shown, FIG. 1 illustrates a conventional field isolation oxide structure 10 including a semiconductor substrate 11, a field isolation oxide region 13, an active region 17, and a bird's beak type structure 15. As shown, the bird's beak type structure prevents formation of devices in active regions because of thickness 19.

Various techniques have been proposed to overcome the undesirable effects of the bird's beak type structure. In particular, formation of a thinner oxide layer often creates a shorter bird's beak length. A thicker nitride layer also creates a shorter bird's beak length. But such techniques induce more crystal defects to the silicon substrate or the like. The crystalline defects increase resistance in the substrate, thereby causing switching problems or the like. The thinner bird's beak type structure also causes electrical current leakage between adjacent devices, by not effectively isolating such devices.

Another technique has been proposed to provide a thicker oxide layer to create a thicker bird's beak type structure. The thicker bird's beak type structure tends to prevent electric leakage between devices. But the thicker bird's beak type structure causes a longer bird's beak, that is, a bird's beak which protrudes further into the active device region. The longer bird's beak structure also reduces packing density of integrated circuits, which is clearly an undesirable result.

Still another technique uses a "poly-buffered" LOCOS method. The poly-buffered LOCOS method relies upon a multi-layered sandwich structure including an oxide layer, a polysilicon layer, and a nitride layer. The poly-buffered LOCOS method reduces lateral encroachment of silicon dioxide. But the poly-buffered LOCOS method creates a second bird's beak type structure as illustrated by FIG. 2. As shown, FIG. 2 illustrates conventional field isolation oxide regions 20 made by way of the conventional poly-buffered LOCOS method. The conventional method provides a semiconductor substrate field isolation oxide regions 23, a first bird's beak type structure 25, and a second bird's beak type structure 29. Another limitation with the poly-buffered LOCOS method includes polysilicon etching residues 27 remaining on edges of the field isolation oxide regions. The second bird's beak type structure and etching residues are clearly undesirable results.

From the above it is seen that a method of fabricating a semiconductor isolation region that is easy, cost effective, and reliable is often desired.

SUMMARY OF THE INVENTION

The present invention provides an improved method and resulting integrated circuit device structure. The present field isolation oxide region fabrication method provides a relatively consistent and easy to fabricate structure, with substantially no bird's beak type structures.

In a specific embodiment, the present invention provides a method of forming a semiconductor integrated circuit. The present method includes the steps of providing a semiconductor substrate with a top surface. The present method also includes forming a pad oxide layer overlying the top surface, forming a polysilicon layer overlying the pad oxide layer, and forming a second silicon nitride layer overlying the silicon nitride layer. The second silicon nitride layer is much thicker than the first layer of silicon nitride. A step of patterning the second silicon nitride layer, the first silicon nitride layer, and the polysilicon layer to define a mask is also provided. The mask includes exposed regions of the pad oxide layer.

An alternative embodiment provides a semiconductor substrate with a top surface. The present embodiment also includes an oxide layer overlying the top surface, a polysilicon layer overlying the oxide layer. A first silicon nitride layer is overlying the polysilicon nitride layer, and a second silicon nitride layer is overlying the first silicon nitride layer. The second silicon nitride layer is much thicker than the first layer of silicon nitride. In the embodiment provided, the second silicon nitride layer, the first silicon nitride layer, and the polysilicon layer define a mask. The mask includes exposed regions of the pad oxide layer.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

FIGS. 4–8 illustrate simplified fabrication methods of a LOCOS structure according to the present invention.

DESCRIPTION OF THE SPECIFIC EMBODIMENT

Figure 1:
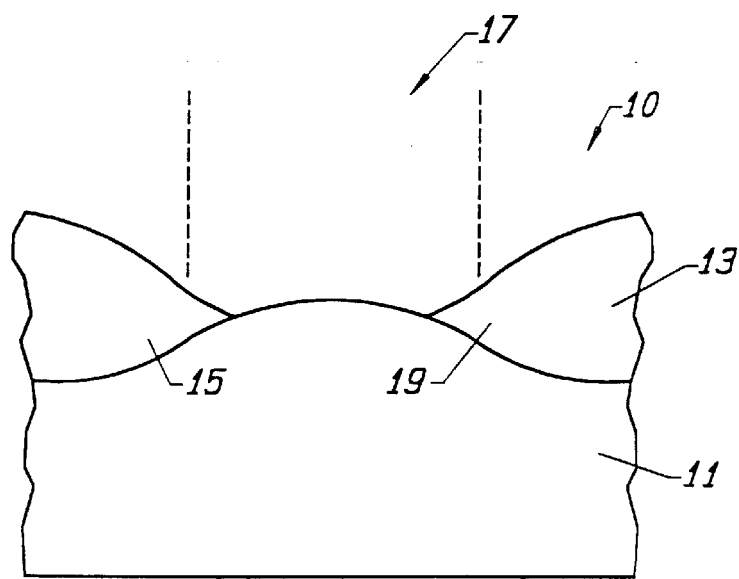
FIGS. 1–2 illustrate the conventional LOCOS structures.
Figure 2:
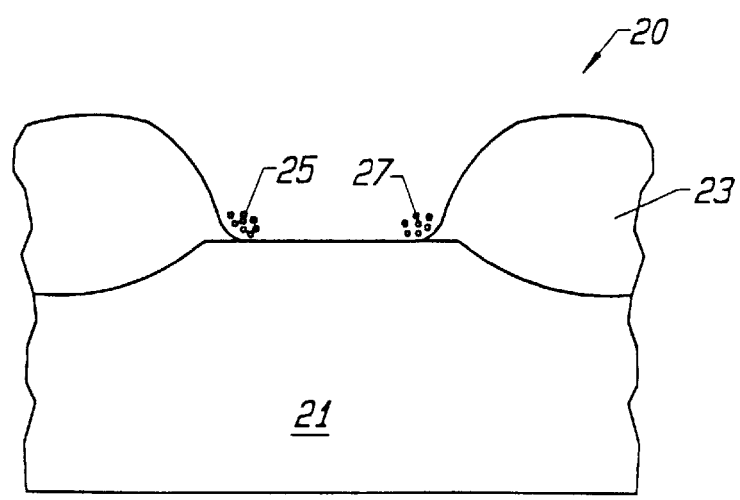
Figure 3:
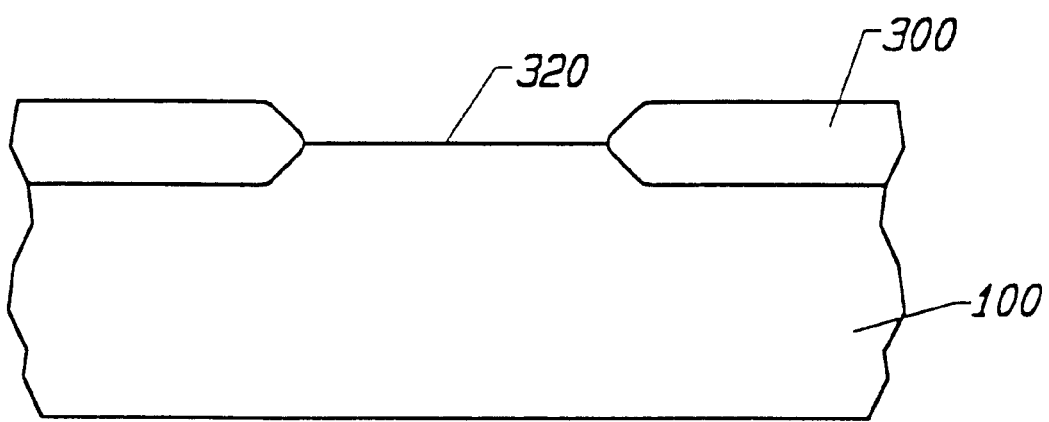
FIG. 3 illustrates a simplified cross-sectional view of a LOCOS structure according to the present invention.

FIG. 3 illustrates a simplified cross-sectional view of the field isolation structure according to the present invention.

The field isolation structure includes a semiconductor substrate 100, field isolation oxide regions 300, an active device region 320, and other elements. As shown, the present field isolation structure provides a relatively planar surface as a site for the active device, and includes substantially no bird's beak type structure. Typically, the bird's beak length ranges from about 0.1 to about 0.3μ for field oxide thickness in the range of about 0.3 to about 0.6μ thick. The present field isolation structure can be made by way of embodiments as described below.

An embodiment of the present field isolation fabrication method is briefly outlined as follows.

(1) Provide a semiconductor substrate.
(2) Form a pad oxide layer (or oxide layer) on a surface of the substrate.
(3) Form a polysilicon layer overlying the pad oxide layer.
(4) Form a very thin film of high quality silicon nitride on the polysilicon layer.
(5) Form a thicker layer of silicon nitride on the very thin film of high quality silicon nitride.
(6) Pattern the thicker layer of silicon nitride, very thin film of high quality silicon nitride, and polysilicon layer to form exposed regions for field isolation oxide regions.
(7) Form the field isolation oxide regions in the exposed regions.
(8) Remove the silicon nitride layers, the polysilicon layer, and the pad oxide layer.
(9) Perform remaining process steps.

The aforementioned steps rely upon a combination of layers including a polysilicon layer, a very thin film of high quality silicon nitride, and a thicker layer of silicon nitride as an oxidation mask. The present oxidation mask tends to substantially prevent crystal defects in the semiconductor substrate during processing. Substantially no polysilicon residues remain on edges of the field isolation oxide regions after removing the silicon nitride layers and the polysilicon layer. The present oxidation mask also prevents pits from forming on active regions during subsequent processes. Moreover, the conventional bird's beak type structure is substantially eliminated by way of the present oxidation mask. Details of the present method are described by way of the Figs. below.

FIGS. 4–8 illustrate a simplified fabrication method of a field isolation structure according to the present invention. The simplified fabrication method is merely an illustration, and should not limit the scope of the claims as described herein.

FIG. 4 illustrates a starting point for a fabrication method according to the present invention. The present method begins by providing a semiconductor substrate 100. The semiconductor substrate can be any suitable substrate such as a silicon wafer, and the like, but is preferably a silicon wafer. Of course the type of wafer used depends upon the particular application.

The present method forms an insulation layer such as a silicon dioxide ($SiO_2$) layer 120 or the like (also known as a pad oxide layer) on a top surface 115 of the semiconductor substrate 100. The silicon dioxide layer is preferably made by a technique of thermal oxidation of silicon at a temperature of about 1000° C. and greater to form a high quality substantially pinhole free silicon dioxide layer 120. A thickness of the silicon dioxide layer ranges from about 50 Å to about 500 Å, and is preferably at about 300 Å.

A step of forming a polysilicon layer 140 overlying a top surface 130 of the pad oxide layer is performed. The polysilicon layer 140 is preferably made by way of a low pressure chemical vapor deposition (LPCVD) technique or the like. For example, the LPCVD technique includes a reactant gas such as silane ($SiH_4$) or the like at a pressure ranging from about 100 mTorr to about 300 mTorr, and is preferably at about 200 mTorr. The LPCVD also includes a reaction temperature ranging from about 550° C. to about 700° C., and is preferably at about 620° C. By way of a preferred embodiment, the polysilicon layer includes a thickness ranging from about 300 Å to about 1500 Å. Of course, the particular reactants, temperatures, pressures, and the like depend upon the application.

FIG. 5 illustrates a simplified method of forming a thin film of silicon nitride 160 overlying a top surface 155 of the polysilicon layer 140. The thin film of silicon nitride is a high quality substantially pinhole free layer of silicon nitride. A suitable technique for fabrication of such silicon nitride layer includes exposing the polysilicon layer 160 to a high temperature atmosphere of a nitrogen source such as an ammonia gas ($NH_3$) for nitridation so that a very thin film of silicon nitride ($Si_3N_4$) or the like is formed from the polysilicon layer. The temperature of such nitridation ranges from about 700° C. to about 1100° C., and is preferably at about 950° C. The ammonia gas includes a concentration ranging from about 0.1% to about 100%, and is preferably at about 95%. The very thin layer of silicon nitride ranges in thickness from about 5 Å to about 100 Å, and is preferably about 30 Å and less.

Figure 6:
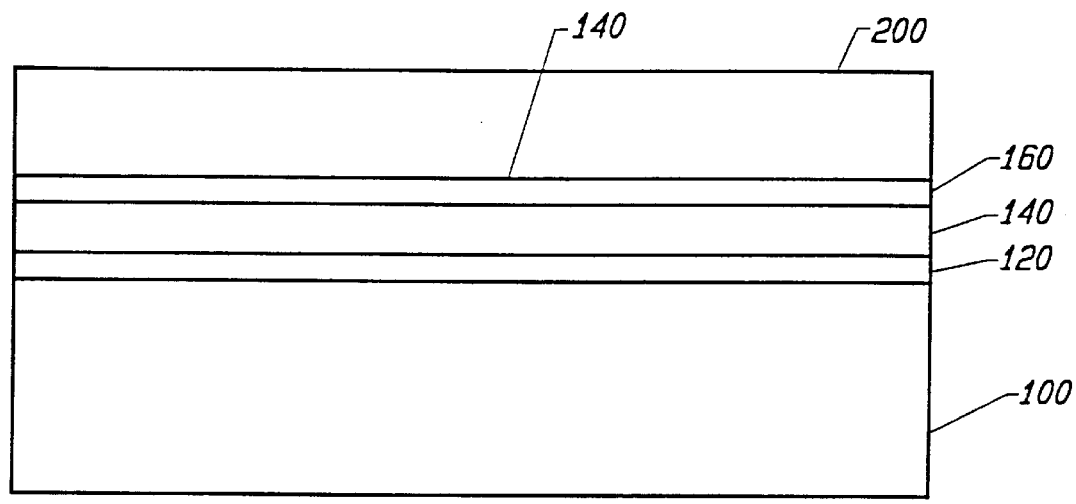

The present method then includes a step of depositing a layer of silicon nitride 200 overlying a top surface 190 of the very thin layer of silicon nitride 160 as illustrated by FIG. 6. The silicon nitride layer 200 can be deposited by a suitable LPCVD method or the like. An example of such method relies upon a reactant gas such as a dichlorosilane ($SiH_2Cl_2$) and an ammonia gas ($NH_3$) and the like. A reaction pressure can range from about 100 mTorr to about 500 mTorr, and is preferably at about 350 mTorr. A reaction temperature ranges from about 600° C. to about 800° C., and is preferably at about 760° C. By way of a preferred embodiment, the silicon nitride layer 200 includes a thicknesses ranging from about 500 Å and 3000 Å, and is preferably at about 2000 Å. As shown, the present method employs a sandwich layer including the polysilicon layer 140, the very thin silicon nitride layer 160, and the silicon nitride layer 200 to define an oxidation mask or the like.

Figure 7:
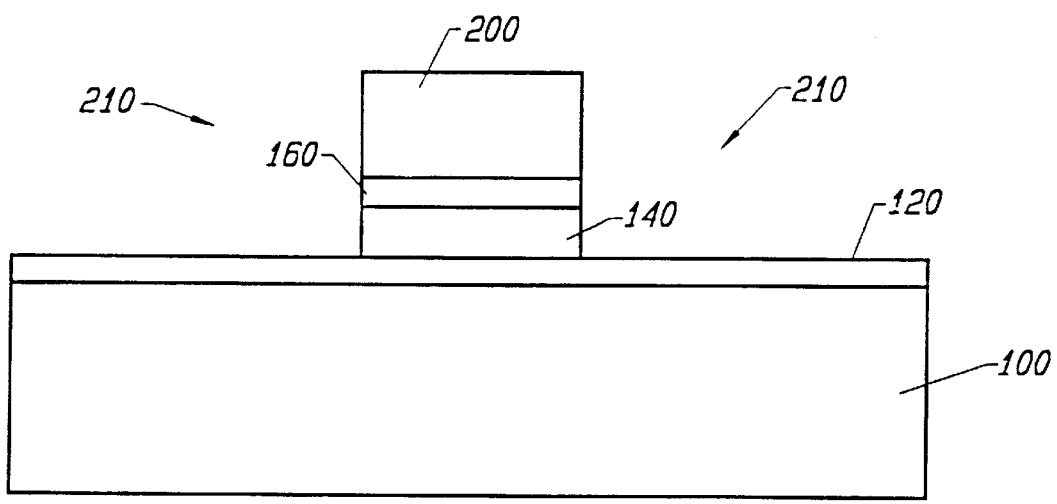

The layers are patterned and etched as illustrated in FIG. 7. The oxidation mask forms exposed regions 210 which define sites for field isolation oxide regions and the like. Etching occurs by way of plasma etching, reactive ion etching, or the like. Preferably, the etching occurs by anisotropically patterning the polysilicon layer 140, the very thin film of silicon nitride 160, and the silicon nitride layer 200 by way of plasma etching techniques. The pad oxide layer serves as an etch stop layer for the plasma etching technique. Alternatively, the pad oxide layer can be a portion of the oxidation mask.

The plasma etching technique can rely upon a plasma etching apparatus (also known as a plasma etcher) such as a product sold by the name of RAINBOW 4520 by Lam Research Company in Fremont, Calif. Plasma etching occurs at a pressure ranging from about 300 mTorr to about 500 mTorr, and is preferably at about 400 mTorr. Power ranges from about 400 watts to about 700 watts, and is preferably about 525 watts. The plasma etcher relies upon reactant gases such as argon (Ar), oxygen ($O_2$), and trifluoro-methane ($CHF_3$) or the like. A flow rate for argon ranges from about 100 sccm to about 400 sccm, and is preferably at about 320 sccm. Trifluoro-methane includes a flow rate ranging from about 10 sccm to about 50 sccm, and is preferably at about 20 sccm. Oxygen includes a flow rate from about 10 sccm to about 200 sccm, and is preferably at about 50 sccm. Of course, the reactant species, flow rates, temperatures, pressures, power, and the like will depend upon the particular application.

Figure 8:
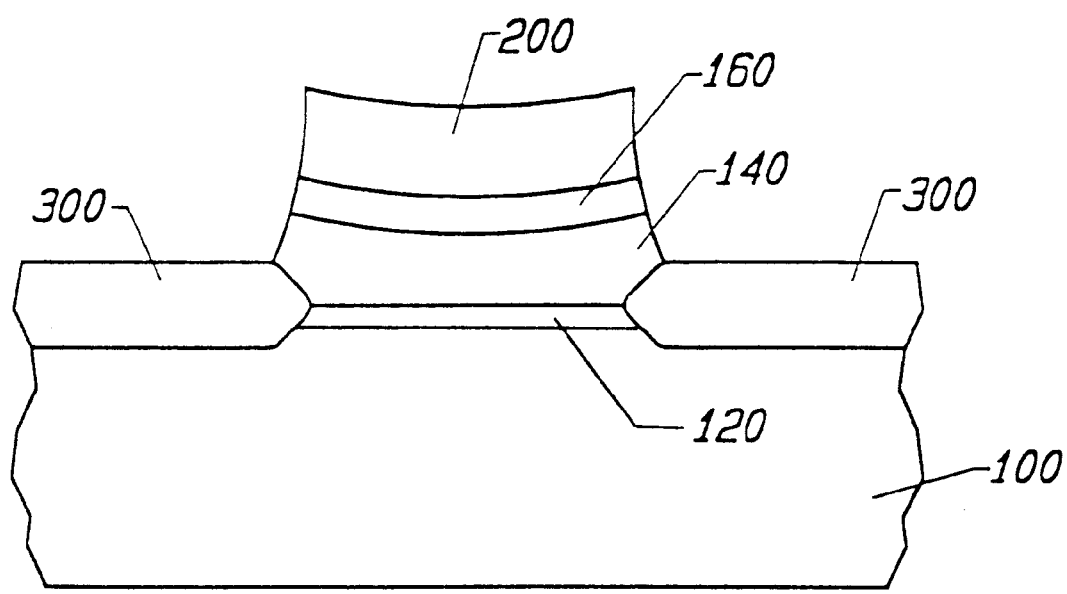

The structure of FIG. 7 undergoes a step of thermal oxidation as illustrated by FIG. 8. Thermal oxidation occurs using a high temperature atmosphere such as oxygen ($O_2$) or the like using the sandwich layer as the oxidation mask. Thermal oxidation occurs at a temperature ranging from about 900° C. to about 1100° C., and is preferably at about 1000° C. The structure undergoes thermal oxidation for a time period ranging from about 150 minutes to about 190 minutes, and is preferably less than about 170 minutes. The thermal oxidation step creates field isolation oxide regions 300 having a thickness of about 4500 Å to about 6500 Å, and is preferably at about 5000 Å.

The present method then removes the oxidation mask by way of a sequence of etching steps. The present method removes the silicon nitride layers by way of an etching technique such as a hot phosphoric acid solution ($H_3PO_3$) or the like. The polysilicon layer is removed by way of an isotropic plasma etching technique or the like. A solution of dilute hydrofluoric acid (HF) or the like removes the pad oxide layer. The structure is then ready for remaining processing steps. Of course, other techniques for removing the oxidation mask may also be used depending upon the particular application.

While the above is a full description of the specific embodiments, various modifications, alternative constructions and equivalents may be used. For example, while the description above is in terms of a general field isolation oxide structure for a field effect transistor, it would be possible to implement the present invention with MOS circuits, BiCMOS circuits, bipolar circuits, N or P well regions of circuits, or the like.

Therefore, the above description and illustrations should not be taken as limiting the scope of the present invention which is defined by the appended claims.

What is claimed is:

1. A semiconductor device comprising:
   a semiconductor substrate;
   an oxide layer at least partially covering said substrate;
   a polysilicon layer partially covering said oxide layer;
   a first buffer means compressing silicon nitride at least partially covering said polysilicon layer;
   a second buffer means compressing silicon nitride at least partially covering said first buffer means, said first buffer means having a higher quality than said second buffer means; and
   a field isolation oxide region at least partially covering said oxide layer and having a substantially reduced bird's beak structure disposed between said oxide layer and said polysilicon layer.

2. The semiconductor device of claim 1 wherein said field isolation oxide region has a thickness of about 0.3 µm to about 0.6 µm.

3. The semiconductor device of claim 1 wherein said bird's beak type structure has a length of about 0.1 µm to about 0.3 µm.

4. The semiconductor device of claim 1 wherein said polysilicon layer has a thickness of about 300 Å to about 1500 Å.

5. The semiconductor device of claim 1 wherein said first buffer means is substantially pinhole free.

6. The semiconductor device of claim 1 wherein said first buffer means has a thickness of at least about 5 Å.

7. The semiconductor device of claim 1 wherein said second buffer means has a thickness of at least about five times greater than said second buffer means.

8. The semiconductor device of claim 1 wherein said first buffer means has a thickness of less than about 100 Å.

9. The semiconductor device of claim 1 wherein said second buffer means has a thickness ranging from about 500 Å to about 3,000 Å.

10. The semiconductor device of claim 1 wherein said polysilicon layer, said first buffer means and said second buffer means define a mask.

11. The semiconductor device of claim 10 wherein said mask is an oxidation mask.

12. The semiconductor device of claim 1 wherein said second buffer means is formed by a chemical vapor deposition technique.

13. A semiconductor device comprising:
    a semiconductor substrate;
    an oxide layer at least partially covering said substrate;
    a polysilicon layer partially covering said oxide layer;
    a first silicon nitride layer at least partially covering said polysilicon layer;
    a second silicon nitride layer at least partially covering said first silicon nitride layer, said first silicon nitride layer having a higher quality than said second silicon nitride layer, said second silicon nitride layer being formed by a chemical vapor deposition technique; and
    a field isolation oxide region at least partially covering said oxide layer and having a substantially reduced bird's beak structure disposed between said oxide layer and said polysilicon layer.

14. The semiconductor device of claim 13 wherein said field isolation oxide region has a thickness of about 0.3 µm to about 0.6 µm.

15. The semiconductor device of claim 13 wherein said bird's beak type structure has a length of about 0.1 µm to about 0.3 µm.

16. The semiconductor device of claim 13 wherein said polysilicon layer has a thickness of about 300 Å to about 1500 Å.

17. The semiconductor device of claim 13 wherein said first silicon nitride layer is substantially pinhole free.

18. The semiconductor device of claim 13 wherein said first silicon nitride layer has a thickness of at least about 5 Å.

19. The semiconductor device of claim 13 wherein said second silicon nitride layer has a thickness of about five times greater than said second silicon nitride layer.

20. The semiconductor device of claim 13 wherein said first silicon nitride layer has a thickness of less than about 100 Å.

21. The semiconductor device of claim 13 wherein said second silicon nitride layer has a thickness ranging from about 500 Å to about 3,000 Å.

22. The semiconductor device of claim 13 wherein said polysilicon layer, said first silicon nitride layer and said second silicon nitride layer define a mask.

23. The semiconductor device of claim 13 wherein said mask is an oxidation mask.

24. A semiconductor integrated circuit structure, said structure comprising:
    a semiconductor substrate having a top surface;
    an oxide layer partially overlying said top surface;
    a polysilicon layer partially overlying said oxide layer;

a first silicon nitride layer overlying said polysilicon layer; and a second silicon nitride layer overlying said first silicon nitride layer, said first silicon nitride layer having a higher quality than said second silicon nitride layer, wherein said second silicon nitride layer, said first silicon nitride layer, and said polysilicon layer define a mask, said mask comprising exposed regions of said oxide layer.

25. The structure of claim 24 further comprising field isolation oxide regions defined in said exposed regions.

26. The structure of claim 24 wherein said oxide layer is formed by a thermal oxide process.

27. The structure of claim 24 wherein said first silicon nitride layer has a thickness of less than about 100 Å.

28. The structure of claim 24 wherein said first silicon nitride layer is a substantially pin hole free silicon nitride layer.

29. The structure of claim 24 wherein said first silicon nitride layer is made by reacting a nitrogen source with said silicon in said polysilicon layer.

30. The structure of claim 24 wherein said second silicon nitride layer is made by chemical vapor deposition technique.

31. The structure of claim 24 wherein said second silicon nitride layer includes a thickness ranging from about 500 Å to about 3,000 Å.

32. The structure of claim 24 wherein said first silicon nitride layer has a thickness of at least about 5 Å.

33. The structure of claim 24 wherein said second silicon nitride layer has a thickness of at least about five times greater than a thickness of said first silicon nitride layer.

34. The structure of claim 24 wherein said mask is an oxidation mask.

* * * * *

UNITED STATES PATENT AND TRADEMARK OFFICE
CERTIFICATE OF CORRECTION

PATENT NO. : 6,204,547 B1
DATED : March 20, 2001
INVENTOR(S) : Wen-Doe Su

It is certified that error appears in the above-identified patent and that said Letters Patent is hereby corrected as shown below:

Column 5, claim 1,
Lines 47-52,
a first buffer means [compressing] <u>comprising</u> silicon nitride at least partially covering said polysilicon layer;
a second buffer means [compressing] <u>comprising</u> silicon nitride at least partially covering said first buffer means, said first buffer means having a higher quality than said second buffer means; and Signed and Sealed this Sixth Day of November, 2001

*Attest:*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO.    : 6,204,547 B1                                                   Page 1 of 1
DATED         : March 20, 2001
INVENTOR(S)   : Wen-Doe Su It is certified that error appears in the above-identified patent and that said Letters Patent is hereby corrected as shown below:

<u>Title page,</u>
Item [75], Inventors, should read:
-- [75] Inventors: Wen-Doe Su, Hsinchu (TW) --

Signed and Sealed this

Twenty-fourth Day of June, 2003

JAMES E. ROGAN
*Director of the United States Patent and Trademark Office*